United States Patent [19]

Takeuchi et al.

[11] Patent Number: 4,589,094
[45] Date of Patent: May 13, 1986

[54] MAGNETIC BUBBLE DEVICE

[75] Inventors: Teruaki Takeuchi, Kokubunji; Ryo Suzuki, Hachioji; Naoki Kodama, Hachioji; Masatoshi Takeshita, Hachioji; Yutaka Sugita, Tokorozawa, all of Japan

[73] Assignee: Hitachi, Ltd., Tokyo, Japan

[21] Appl. No.: 633,929

[22] Filed: Jul. 24, 1984

[30] Foreign Application Priority Data

Jul. 27, 1983 [JP] Japan .................. 58-135817

[51] Int. Cl.⁴ .............................................. G11C 19/08
[52] U.S. Cl. .......................................... 365/36; 365/38
[58] Field of Search ....................... 365/36, 38, 42

[56] References Cited

U.S. PATENT DOCUMENTS

| | | | |
|---|---|---|---|
| 3,518,643 | 6/1970 | Perneski | 365/38 |
| 3,534,346 | 10/1970 | Bobeck | 365/38 |
| 3,540,019 | 11/1970 | Bobeck et al. | 365/42 |
| 4,402,060 | 8/1983 | Best et al. | 365/36 |
| 4,403,304 | 9/1983 | Gergls | 365/36 |
| 4,403,305 | 9/1983 | Keefe et al. | 365/36 |

Primary Examiner—James W. Moffitt
Attorney, Agent, or Firm—Antonelli, Terry & Wands

[57] ABSTRACT

A magnetic bubble device includes ion-implanted bubble propagation tracks of meandering cord-like configuration to assure improved bubble propagation characteristic. Amplitude of a region in which inplane magnetization layer is absent or alternatively thickness thereof is smaller than that of other region, as measured in the direction perpendicular to the bubble propagating direction, is not greater than $\frac{7}{8}$ of a pitch of the meandering pattern in the bubble propagating direction. The amplitude is more preferably selected so as to meet the condition that $\frac{1}{4} \leq W/P \leq \frac{3}{4}$ for assuring much stabilized bubble propagating operation.

6 Claims, 10 Drawing Figures

MAGNETIC BUBBLE DEVICE

BACKGROUND OF THE INVENTION

The present invention relates generally to a magnetic bubble device and more particularly to a magnetic bubble device which includes magnetic bubble propagation tracks formed through ion implantation and which enjoys a wide operation margine and a stabilized operation.

Among the magnetic bubble propagation tracks formed through ion implantation, there is known bubble propagation tracks of a meandering or undulated pattern, as is disclosed in "Bell Syst. tech. J.", Vol. 59, p. 229 (1980).

As schematically shown in FIG. 1, a magnetic bubble device is generally made up of a plurality of minor loops 2 for storing therein information and a major line or major loop for reading and writing information. Various parts 4 such as a transfer gate, a swap gate and a replicator are used at connecting portions between the minor loops 2 and the major line (or major loop). The minor loops 2 are formed of bubble propagation tracks, and occupy most of the area of the magnetic bubble device. The major line (or major loop) is made up of bubble propagation tracks 10 and 12, a bubble generator 6 and a detector 8. The minor loops 2 are connected to the major line (or major loop) through the parts 4 such as the transfer gate, the swap gate and the replicator. Although only two minor loops are shown in FIG. 1, it is needless to say that the magnetic bubble device is actually provided with a large number of minor loops.

FIG. 2 shows a configuration or pattern of the propagation tracks which constitute the minor loop. In FIG. 2, a reference numeral 14 denotes a region in which an inplane magnetization layer is formed on the surface of a magnetic bubble material through ion implantation, 16 denotes a region in which the inplane magnetization layer is absent or alternatively an inplane magnetization layer shallower than that of the region 14 is formed, and 18 denotes a magnetic bubble. The illustrated propagation tracks are destined to constitute the minor loops at a period or pitch P of 8 $\mu$m. It has been found that a problem arises when the minor loop is to be realized by the propagation tracks of the meandering or undulated configuration at the pitch of 4 $\mu$m or less. More specifically, when the propagation tracks of a cell size of 4 $\mu$m$\times$4 $\mu$m are formed, there arises a problem that slight variation in an amplitude W possibly brought about in the patterning will involve a large variation in the operation margin of the bubble device. This can be explained by the fact that because of the reduced gap between the propagation tracks, erroneous operation is produced by the unwanted transfer of the bubble to the adjacent track.

SUMMARY OF THE INVENTION

An object of the invention is to provide a magnetic bubble device including meandering or undulated magnetic bubble propagation tracks formed through ion implantation, which enjoys a wide operation margin scarcely subjected to variations.

The present invention starts from the discovery that the margin of a biasing magnetic field (simply referred to as the bias field) depends on the distance between rows of the propagation tracks. More specifically, when dimension or amplitude W is selected equal to 4 $\mu$m in the track pattern illustrated in FIG. 2, the margin is 7% if the distance d is 4 $\mu$m, as will be seen in FIG. 3. On the other hand, the margin is increased to 13% for the distance d of 10 $\mu$m. This means that the margin can be correspondingly increased by increasing the distance d. However, the margin can not be increased infinitely but limited to a saturated value. Accordingly, by selecting the distance d at a value sufficiently large for the margin to assume the saturated value, a stable operation can be assured. In general, the value of (W+d) is determined by geometrical factors of other parts. According to the invention, it is proposed to increase the distance d by decreasing correspondingly the width W for a given constant value of (W+d) to thereby realize the propagation track structure which enjoys the correspondingly increased operation margin as well as the reduced variation in the margin. In this connection, it is noted that the sum value of W and d can be determined if the cell size is given, because restriction is imposed to the size of the minor loop and the major line. In other words, the value of W+d is approximately twice as large as the length of one side of the cell. Further, the relation that W+d=8D (where D represents the bubble diameter) applies valid. The bubble diameter D is about P/4, where P represents a period or pitch of the meandering or undulated track. In order to prevent the margin of the bias field from being decreased due to the magnetic influence exerted to the magnetic bubble located at a certain position by the magnetic bubble present in the vicinity of the former, the bubble diameter D should not exceed P/4. On the other hand, the bubble diameter D should be selected at a value as large as possible, in order to assure the improved bubble propagation characteristic. For satisfying both the conditions mentioned above, it is desirable that the bubble diameter D be selected approximately equal to P/4.

In FIG. 2, width t of the non-ion-implanted region 16 (i.e. region in which no ions are implanted) is approximately equal to the bubble diameter D and hence P/4.

DESCRIPTION OF THE PREFERRED EMBODIMENTS

Figure 4:
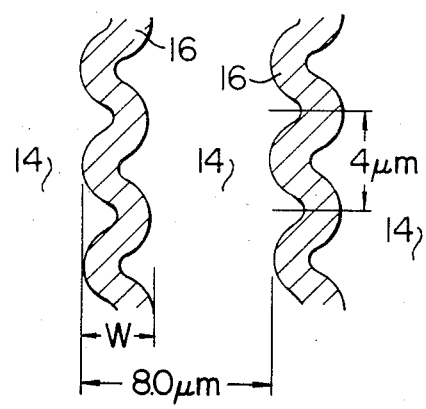
FIG. 4 is a top plan view of an ion-implanted mandering propagation track having a periodical pitch of 4 $\mu$m.
Figure 5:
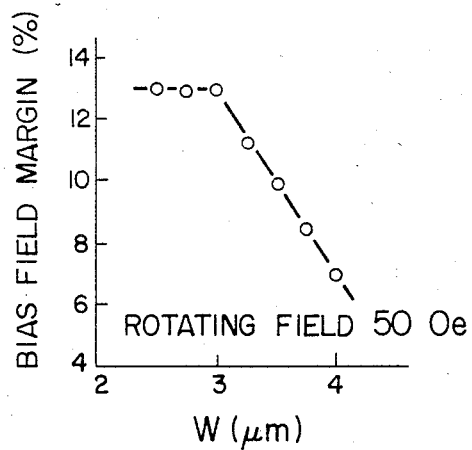
FIG. 5 is a view for illustrating characteristic of the propagation track shown in FIG. 4.

Now, the invention will be described in conjunction with an exemplary embodiment illustrated in FIG. 4, in which like reference numerals denote like parts as those shown is FIG. 2. Referring to FIG. 4, rows of meandering bubble propagation tracks each having a periodical pitch of 4 μm in the bubble propagation direction and an inter-row distance of 8.0 μm are formed. In this bubble device, margin of the bias field was measured by varying the amplitude W of the non ion-implanted meandering pattern. The results of the measurement are illustrated in FIG. 5. It will be seen that when the amplitude W exceeds 3 μm, margin of the bias field undergoes significant variation as a function of W. However, in the range of W smaller than 3 μm, margin is saturated at 13% and remains constant independent of variation in the amplitude W. It will be seen in FIG. 5 that the bias field margin of more than 10% which is practically preferred for the bubble propagation can be obtained when the amplitude W is selected not greater than 3.5/4 (i.e. $\frac{7}{8}$) of the periodical pitch P in the bubble propagating direction. However, in the range of $\frac{3}{4} < W/P \leq \frac{7}{8}$, the margin for the bias field undergoes some variation in dependence on variation in the amplitude W. This means that the bias field margin can not remain constant when the factor W varies slightly due to manufacturing tolerance even if W is dimensioned at a constant value in design. In the range of $W/P \leq \frac{3}{4}$, the margin for the bias field remains constant independent of changes in the amplitude W, advantageously in the practical application.

As described hereinbefore, the width t of the non-ion-implanted region should desirably be approximately equal to P/4. Since the minimum value of the width is t which is equal to about P/4, as described hereinbefore, the minimum value of the amplitude W is about P/4.

From the foregoing, it is established that the condition that $\frac{1}{4} \leq W/P \leq \frac{7}{8}$ should be satisfied for obtaining the practically applicable bias field margin in the propagation track of the meandering pattern. To realize more stable bubble propagation characteristic, the range of $\frac{1}{4} \leq W/P \leq \frac{3}{4}$ is preferred. As described above, in the range of W smaller than 3 μm, the margin is saturated at 13% and undergoes no variation regardless of changes in the amplitude W. In other words, a stable operation can be assured when the value W is smaller than $\frac{3}{4}$ of the periodical pitch P in the bubble propagating direction.

Figure 1:
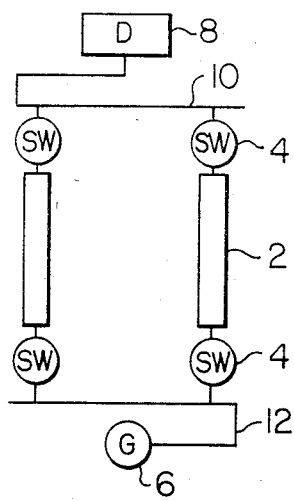
FIG. 1 is a view showing a general arrangement of a magnetic bubble device including minor loops and major lines.
Figure 2:
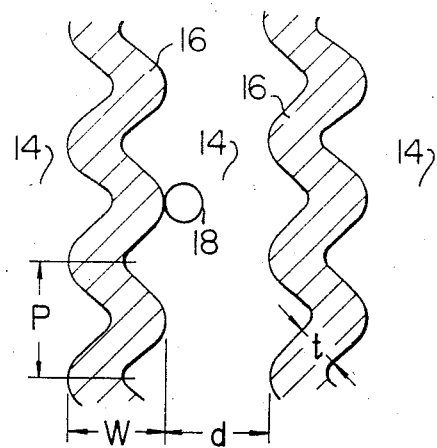
FIG. 2 is a plan view of bubble propagation tracks formed through ion implantation.
Figure 3:
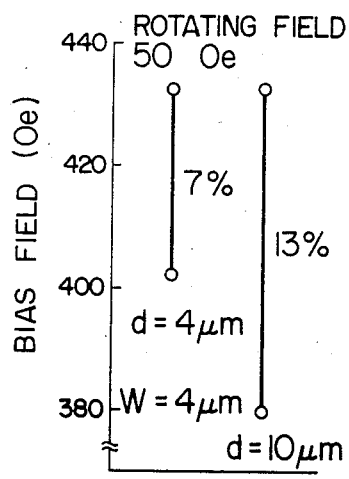
FIG. 3 is a view for illustrating characteristic of the propagation track shown in FIG. 2.
Figure 6:
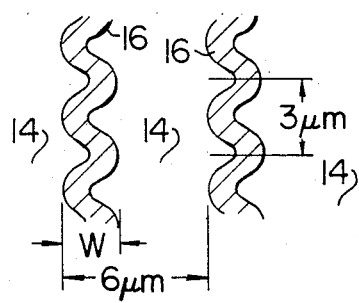
FIG. 6 is a plan view of an ion-implanted mandering propagation track having a pitch of 3 $\mu$m.
Figure 7:
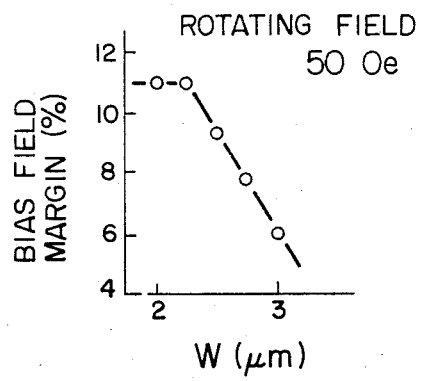
FIG. 7 is a view for illustrating the characteristic of the propagation track shown in FIG. 6.

FIG. 6 shows another embodiment of the invention in which like reference numerals designate like parts shown in FIG. 2 and explanations thereof are omitted. In FIG. 6, rows of the meandering or undulated bubble propagation tracks each having a pitch of 3 μm in the bubble propagating direction are arrayed at a row pitch of 6 μm. In this bubble device, the bias field margin was measured by varying the width W of the non-ion-implanted meandering or undulated pattern. The result of the measurement are illustrated in FIG. 7. It will be seen that when W is smaller than 2.25 μm or when W is smaller than $\frac{3}{4}$ of the pitch P of the meandering track in the bubble propagating direction, the margin is constant, assuring a stable operation. It has been found that the amplitude W should be selected not greater than $\frac{7}{8}$ of the pitch P in order to obtain the practicable bias field margin of more than 10%.

The present invention can assure the stable operation and improved characteristic not only in the bubble device including linear propagation tracks but also in a hybrid bubble device in which a combination of the ion-implanted propagation tracks and permalloy propagation tracks are employed in such a manner as disclosed, for example, in Japanese Patent Application Laid-Open No. 40791/82.

Figure 8:
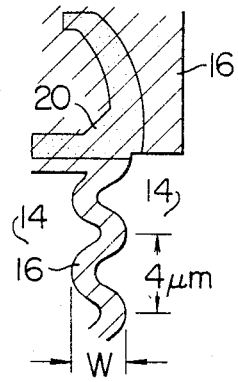
FIG 8 is a plan view showing a junction between the ion-implanted track and a permalloy track in a hybrid bubble device.
Figure 9:
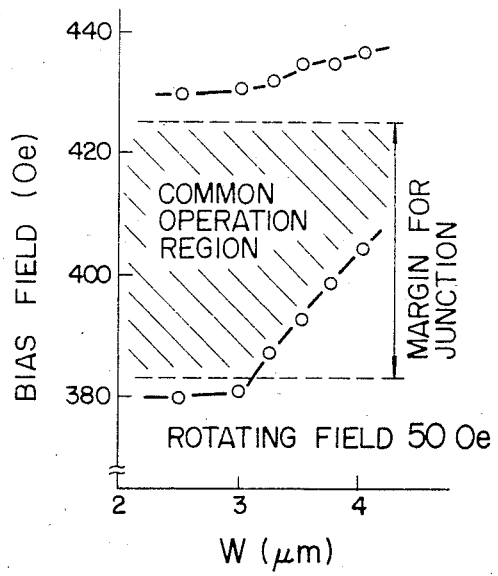
FIG. 9 is a view for illustrating characteristic of the ion-implanted propagation track and a junction between the ion-implanted track and the permalloy track.

In the hybrid device, a junction between the ion-implanted propagation track and the permalloy track presents an important factor. Above all, the characteristic of a transfer junction through which the bubble is transferred from the ion-implanted track to the permalloy track is critical, because the margin permissible at the transfer junction is smaller than those of both the propagation tracks. The transfer junction is realized in a configuration shown in FIG. 8 in which like reference numerals designate like parts shown in FIG. 2 and explanations thereof are omitted. In FIG. 8 reference numeral 20 denotes a permalloy bubble propagation track. Margin for the bias field for the transfer junction is delimited by upper and lower broken lines shown in FIG. 9, in which a curve containing a series of hollow circles represents the bias field margin measured by varying the amplitude W of the non ion-implanted meandering or undulated pattern having a pitch of 4 μm in the bubble propagating direction. In order to assure the wide bias field margin for the whole device, it is necessary that a common operation region shared in common by the bias field margin for the junction and that for the bubble propagation track is wide. When the amplitude W is not greater than 3 μm, the common bias field margin coincides with that of the junction and becomes maximum. More specifically, in the hybrid device, the margin for the bias field for the whole device can be of an adequate value (10%) only when the amplitude W is not greater than $\frac{3}{4}$ of the pitch in the bubble propagating direction.

Figure 10:
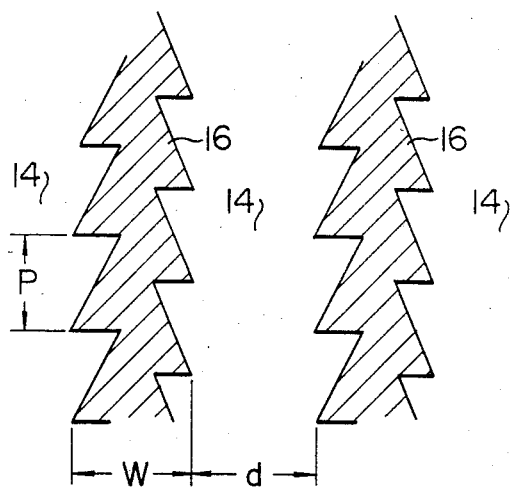
FIG. 10 is a plan view of an ion-implanted tack of a triangularly meandering or undulated form.

FIG. 10 shows a triangularly meandering or undulated track pattern. It has been established that the invention can equally be applied to the magnetic device including this type bubble propagation tracks.

We claim:

1. A magnetic bubble device, including ion-implanted magnetic bubble propagation tracks each being of a meandering form, magnetic bubbles being propagated along both sides of the propagation track, wherein amplitude of a meandering region in which an inplane magnetization layer is absent or thickness of said inplane magnetization layer, if present, is thinner than that of other regions is not greater than $\frac{7}{8}$ of a pitch of said meandering magnetic bubble propagation tracks, said amplitude being measured in the direction perpendicular to the direction in which bubbles are propagated.

2. A magnetic bubble device according to claim 1, wherein said amplitude is so selected that $\frac{1}{4} \leq W/P \leq \frac{7}{8}$.

3. A magnetic device according to claim 2, wherein said amplitude is so selected that $\frac{1}{4} \leq W/P \leq \frac{3}{4}$.

4. A magnetic bubble device according to claim 3, wherein said ion-implanted magnetic bubble propagation track includes a junction between said ion-implanted magnetic bubble propagation track and a magnetic bubble propagation track formed of a soft magnetic material.

5. A magnetic bubble device according to claim 1, wherein said ion-implanted propagation track is of a meandering cord-like configuration.

6. A magnetic bubble device according to claim 1, wherein said ion-implanted propagation track is of a triangularly meandering form.

* * * * *